(12) United States Patent
Zang et al.

(10) Patent No.: US 10,249,616 B2
(45) Date of Patent: Apr. 2, 2019

(54) METHODS OF FORMING A RESISTOR STRUCTURE BETWEEN ADJACENT TRANSISTOR GATES ON AN INTEGRATED CIRCUIT PRODUCT AND THE RESULTING DEVICES

(71) Applicant: GLOBALFOUNDRIES Inc., Grand Cayman (KY)

(72) Inventors: Hui Zang, Guilderland, NY (US); Manfred Eller, Beacon, NY (US); Haiting Wang, Clifton Park, NY (US); Daniel Jaeger, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 53 days.

(21) Appl. No.: 15/627,835

(22) Filed: Jun. 20, 2017

(65) Prior Publication Data

US 2018/0366461 A1 Dec. 20, 2018

(51) Int. Cl.

| | |
|---|---|
| *H01L 49/02* | (2006.01) |
| *H01L 21/3213* | (2006.01) |
| *H01L 21/8234* | (2006.01) |
| *H01L 27/06* | (2006.01) |
| *H01L 27/02* | (2006.01) |
| *H01L 29/66* | (2006.01) |
| *H01L 29/78* | (2006.01) |
| *H01L 29/49* | (2006.01) |

(52) U.S. Cl.
CPC .... *H01L 27/0629* (2013.01); *H01L 21/32133* (2013.01); *H01L 21/823431* (2013.01); *H01L 21/823437* (2013.01); *H01L 27/0207* (2013.01); *H01L 28/20* (2013.01); *H01L 28/24* (2013.01); *H01L 29/66545* (2013.01); *H01L 21/823468* (2013.01); *H01L 29/4958* (2013.01); *H01L 29/4966* (2013.01); *H01L 29/7851* (2013.01)

(58) Field of Classification Search
CPC ..... H01L 28/20; H01L 28/24; H01L 21/3213; H01L 21/32133; H01L 21/823437
See application file for complete search history.

(56) References Cited

U.S. PATENT DOCUMENTS

| | | | |
|---|---|---|---|
| 8,058,125 B1* | 11/2011 | Lin | H01L 27/0629 438/171 |
| 9,478,636 B2* | 10/2016 | Chen | H01L 21/76819 |
| 9,812,365 B1* | 11/2017 | Zhang | H01L 29/66545 |
| 2013/0337643 A1* | 12/2013 | Seong | H01L 29/66477 438/594 |
| 2018/0068948 A1* | 3/2018 | Basker | H01L 21/31051 |
| 2018/0151556 A1* | 5/2018 | Choi | H01L 27/0629 |

\* cited by examiner

*Primary Examiner* — Matthew E Warren
(74) *Attorney, Agent, or Firm* — Amerson Law Firm, PLLC

(57) ABSTRACT

One illustrative method disclosed herein includes, among other things, forming first and second adjacent gates above a semiconductor substrate, each of the gates comprising a gate structure and a gate cap, forming a conductive resistor structure between the first and second adjacent gates, the conductive resistor structure having an uppermost surface that is positioned at a level that is below a level of an uppermost surface of the gate caps of the first and second adjacent gates, and forming first and second separate conductive resistor contact structures, each of which is conductively coupled to the conductive resistor structure.

16 Claims, 17 Drawing Sheets

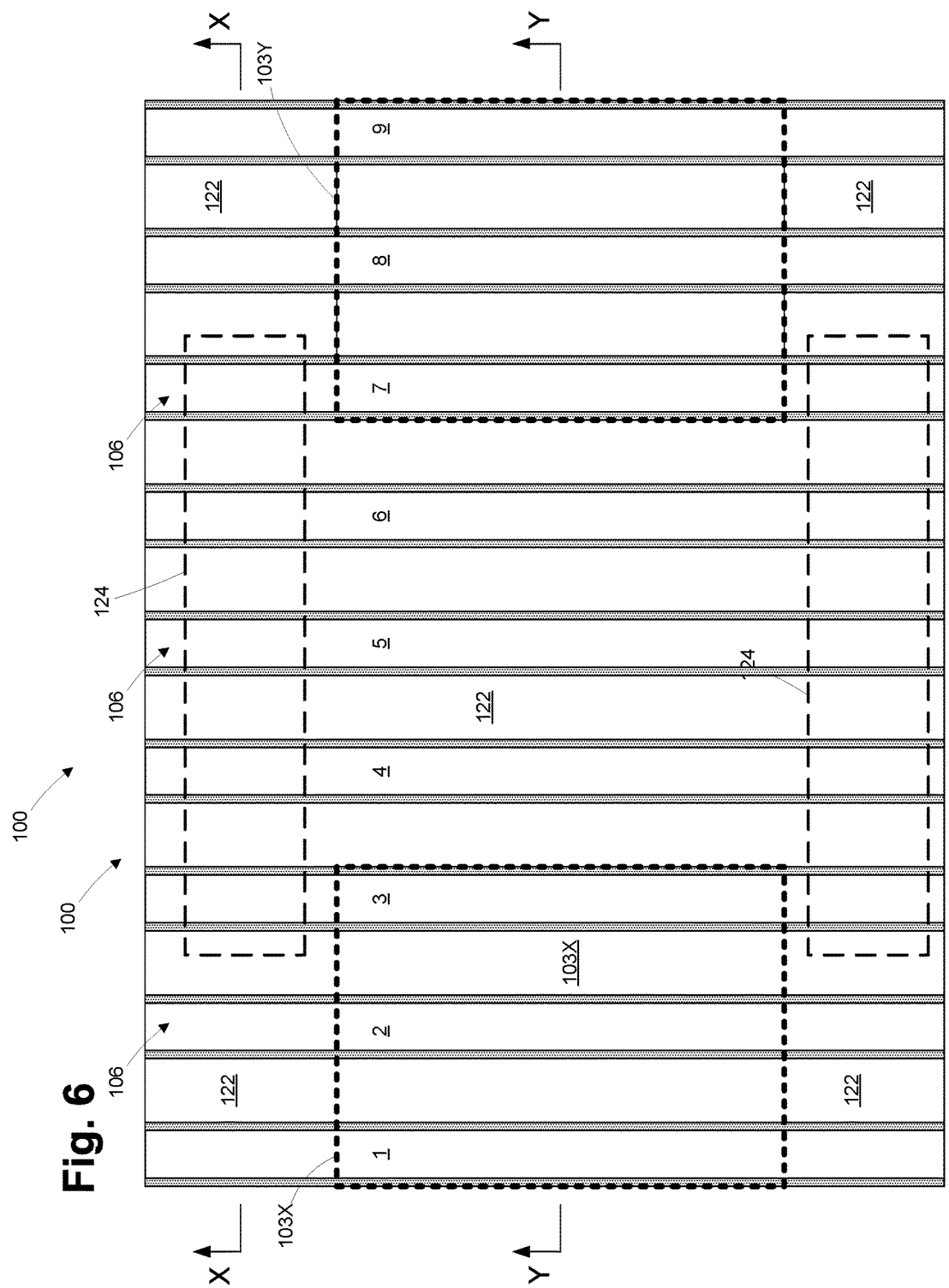

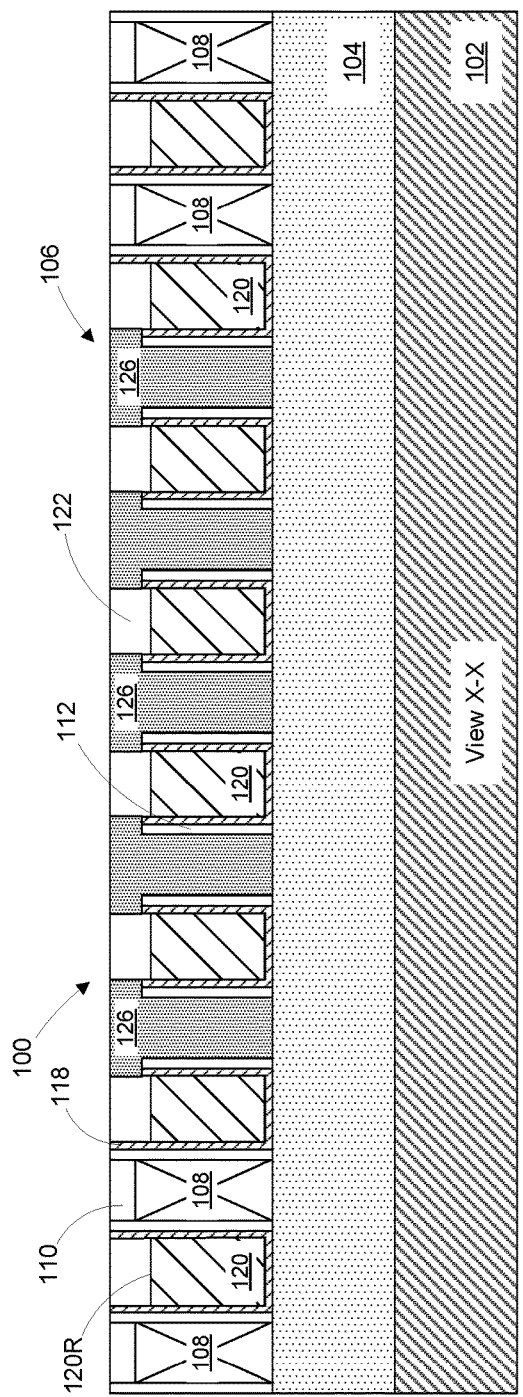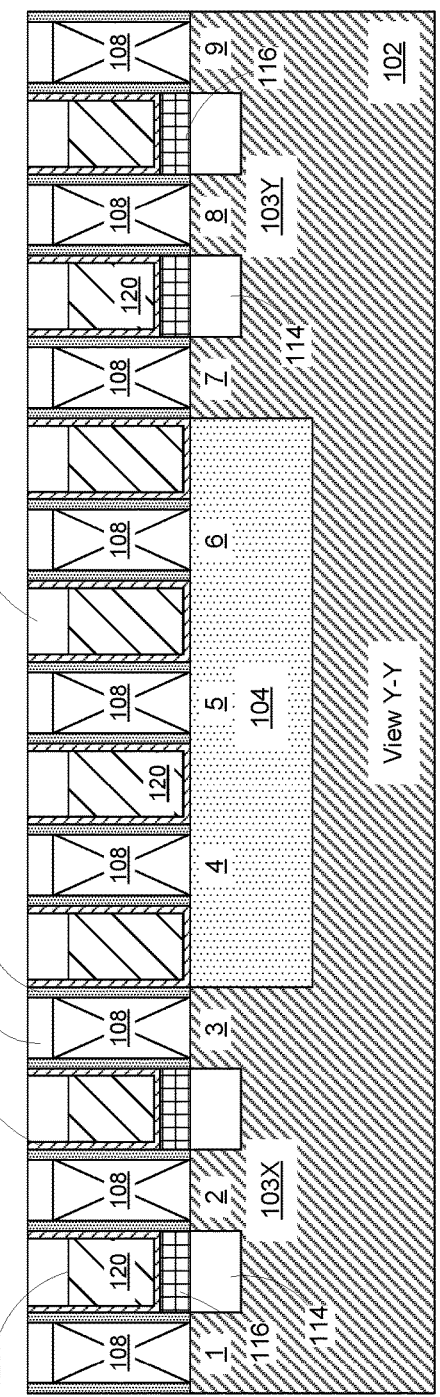

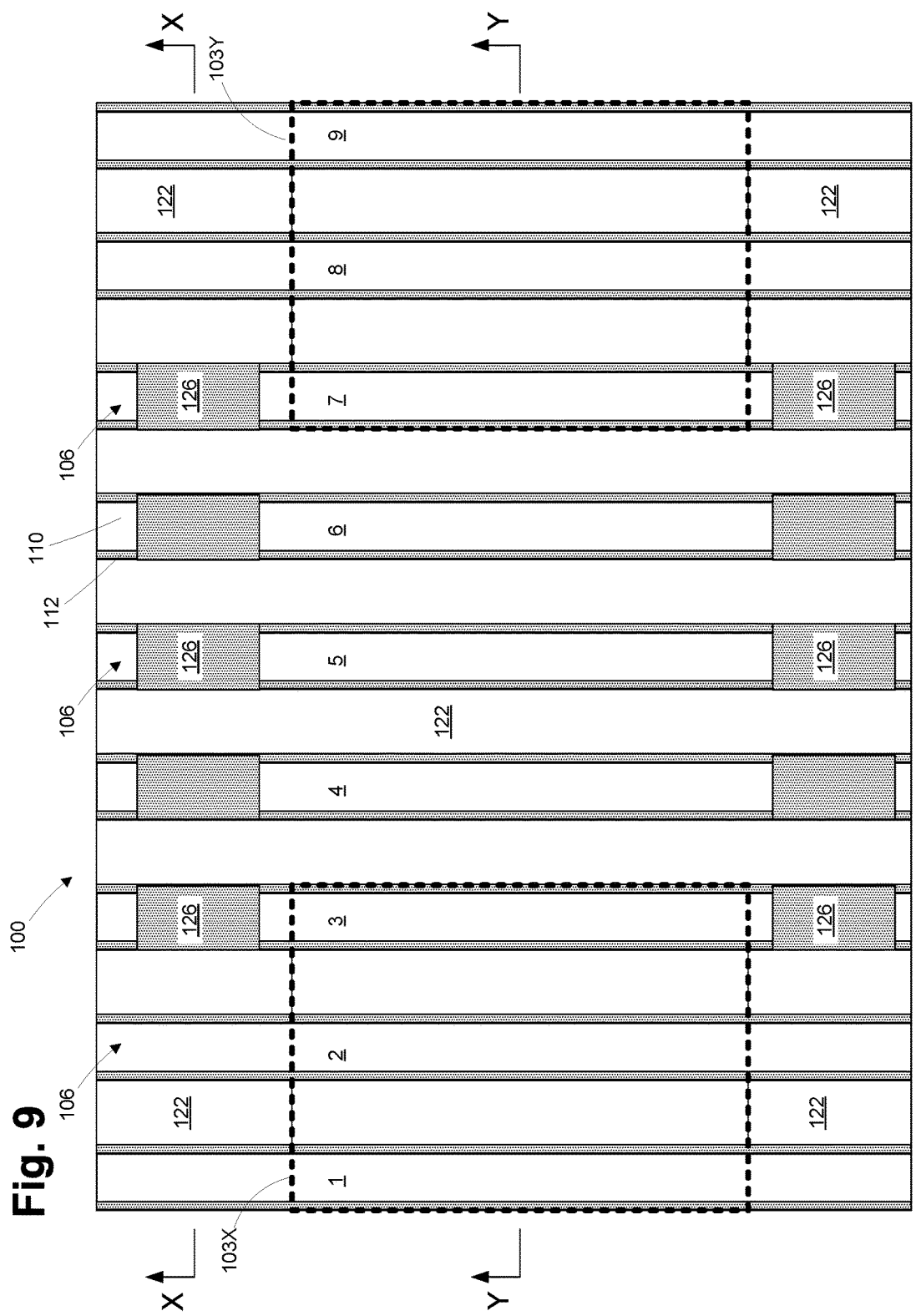

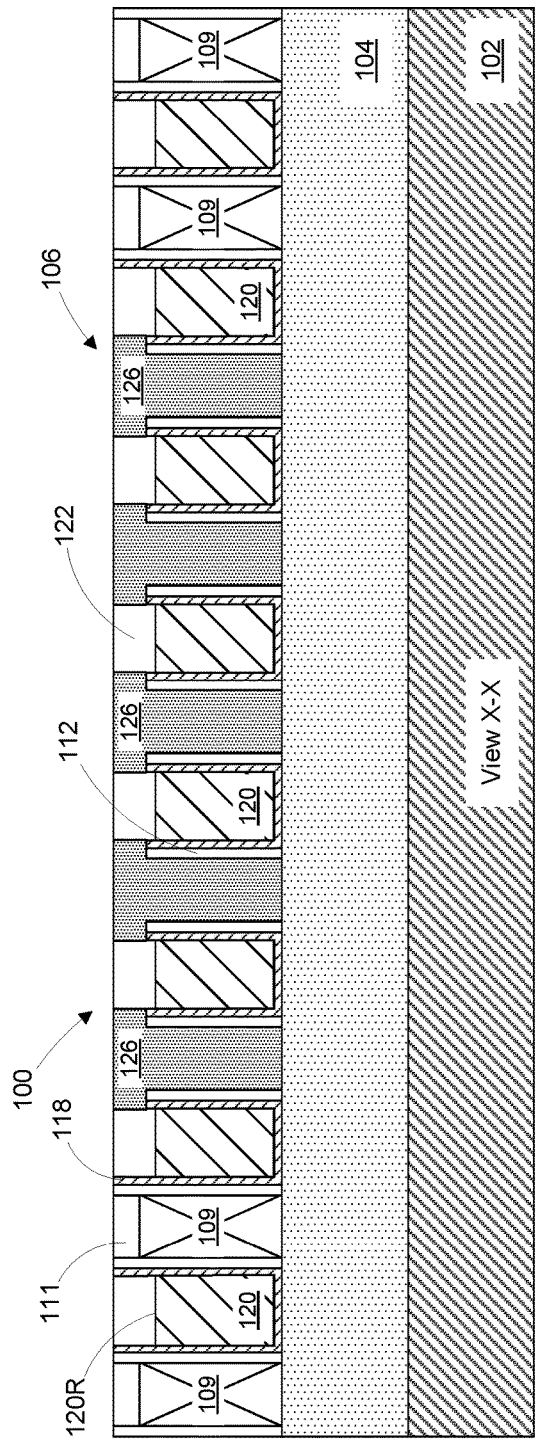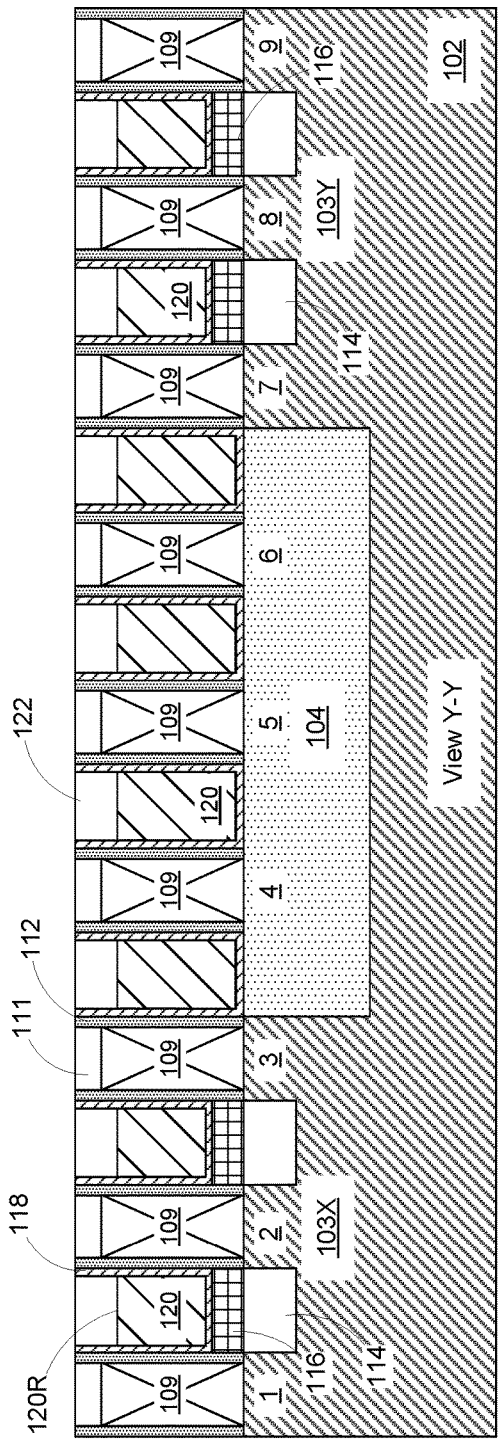

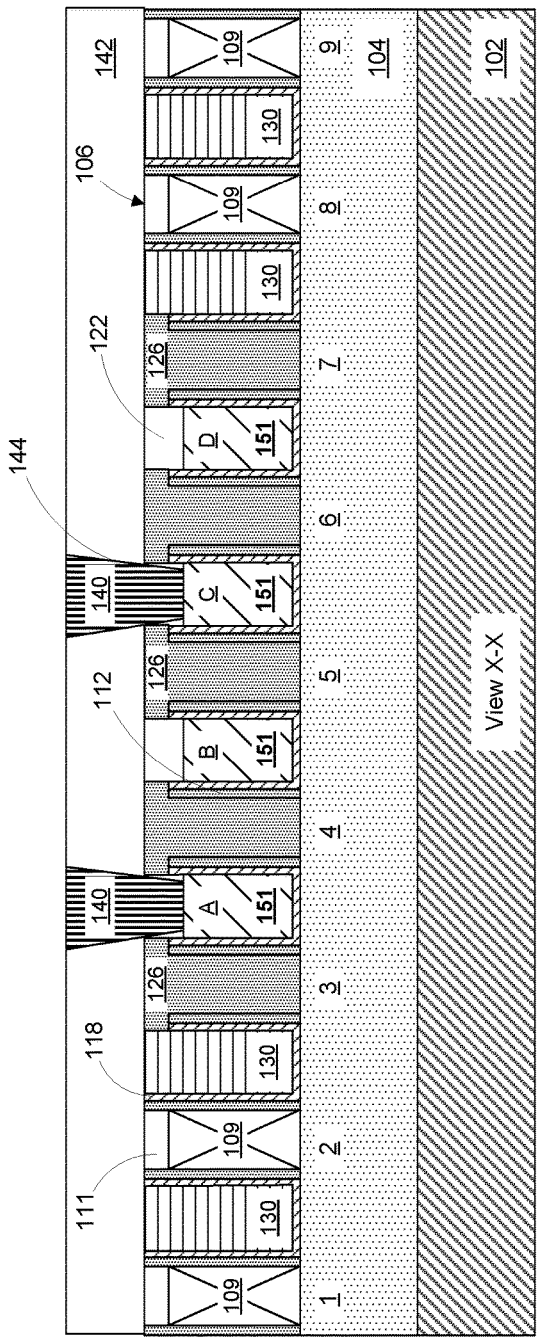
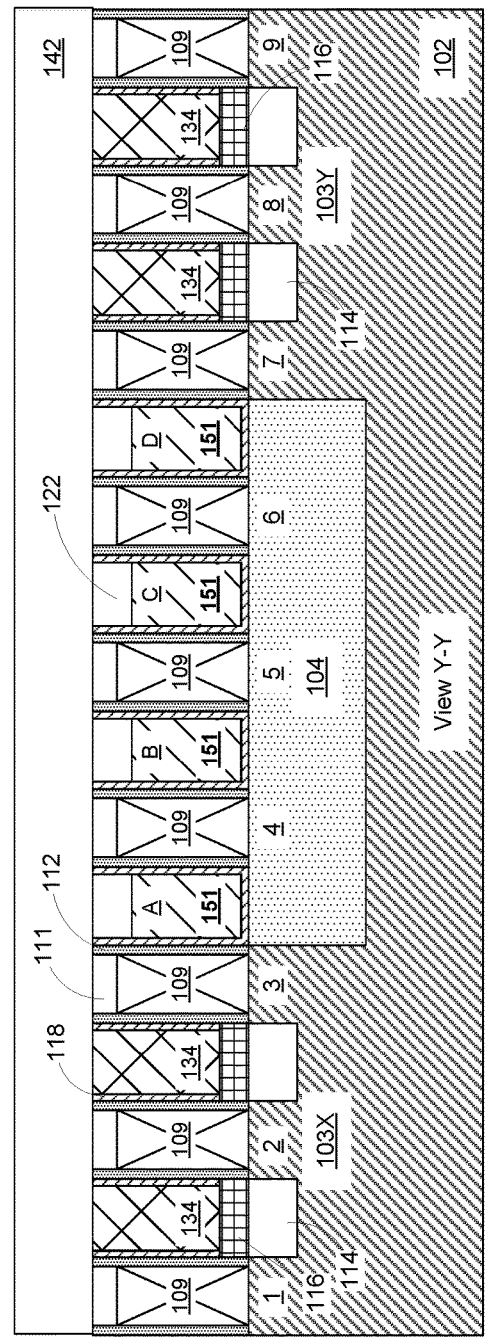

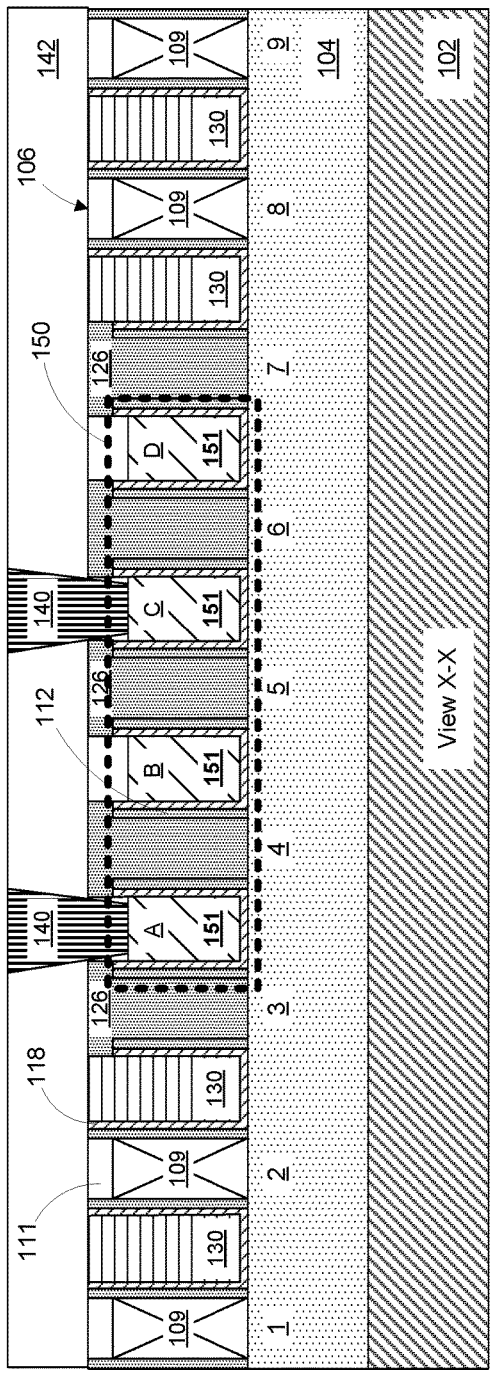

METHODS OF FORMING A RESISTOR STRUCTURE BETWEEN ADJACENT TRANSISTOR GATES ON AN INTEGRATED CIRCUIT PRODUCT AND THE RESULTING DEVICES

BACKGROUND OF THE INVENTION

1. Field of the Invention

The present disclosure generally relates to the fabrication of integrated circuits, and, more particularly, to various methods of forming a resistor structure between adjacent transistor gates on an integrated circuit (IC) product and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

Transistor devices are considered to be "active" devices in that they are switched between an "ON" state and an "OFF" state during the operation of the IC product. The circuits in an IC product also include "passive" devices, such as resistors and capacitors that are positioned in various arrangements in the circuits of the IC product so as to permit the IC product to perform its intended function. For example, resistors may be employed to reduce a voltage level or current applied to a particular portion of an integrated circuit on an IC product.

Passive devices, such as resistors, may be formed using a variety of techniques and they may be located at various locations within an integrated circuit product. As one example, some prior art IC products involved forming a resistor structure in a layer of insulating material at a location that was above the device level contacts formed on an IC product. In other applications, wherein gate structures were formed using replacement gate manufacturing techniques that involved formation of sacrificial gate electrode structures comprised of polysilicon, resistors were formed using some portions of the polysilicon sacrificial gate structures for the resistor structure. However, as the critical dimension of transistor devices and packing densities continue to decrease, there is a need to develop a process for forming resistor structures in an efficient manner that is consistent with meeting ever increasing packing densities goals while making IC products that may be reliably manufactured with acceptable levels of product yield.

The present disclosure is directed to various novel methods of forming a resistor structure between adjacent transistor gates on an integrated circuit (IC) product and the resulting novel devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a resistor structure between adjacent transistor gates on an integrated circuit (IC) product and the resulting novel devices. One illustrative method disclosed herein includes, among other things, forming first and second adjacent gates above a semiconductor substrate, each of the gates comprising a gate structure and a gate cap, forming a conductive resistor structure between the first and second adjacent gates, the conductive resistor structure having an uppermost surface that is positioned at a level that is below a level of an uppermost surface of the gate caps of the first and second adjacent gates, and forming first and second separate conductive resistor contact structures, each of which is conductively coupled to the conductive resistor structure.

Another illustrative method disclosed herein includes, among other things, forming a plurality of laterally spaced apart gates above a semiconductor substrate, each of the gates comprising a gate structure and a gate cap, depositing a layer of conductive resistor material above and between all of the plurality of laterally spaced apart gates, and performing a recess etching process on the layer of conductive resistor material to produce a plurality of individual recessed lines of the conductive resistor material, each of which is positioned between a pair of laterally adjacent gates, each of the individual recessed lines of the conductive resistor material having a recessed uppermost surface that is positioned at a level that is at least below a level of an uppermost surface of the gate caps on the plurality of laterally spaced apart gates. In this illustrative example, the method further includes performing at least one etching process to remove all of the individual recessed lines of the conductive resistor material while masking at least portions of a plurality of the individual recessed lines of the conductive resistor material that will constitute a plurality of conductive resistor structures, each of which is positioned between a respective pair of laterally adjacent gates, and forming a plurality of conductive resistor contact structures to each of the plurality of conductive resistor structures.

One illustrative resistor for an integrated circuity product includes, among other things, first and second adjacent gates positioned above a semiconductor substrate, each of the gates comprising a gate structure and a gate cap, a conductive resistor structure positioned between the first and second adjacent gates, the conductive resistor structure having an uppermost surface that is positioned at a level that is below a level of an uppermost surface of the gate caps of the first and second adjacent gates, and first and second separate conductive resistor contact structures, each of which is conductively coupled to the conductive resistor structure.

BRIEF DESCRIPTION OF THE DRAWINGS

The disclosure may be understood by reference to the following description taken in conjunction with the accompanying drawings, in which like reference numerals identify like elements, and in which:

FIGS. 1-25 depict various novel methods disclosed herein for forming a resistor structure between adjacent transistor gates on an integrated circuit (IC) product and the resulting novel devices.

Figure 1:
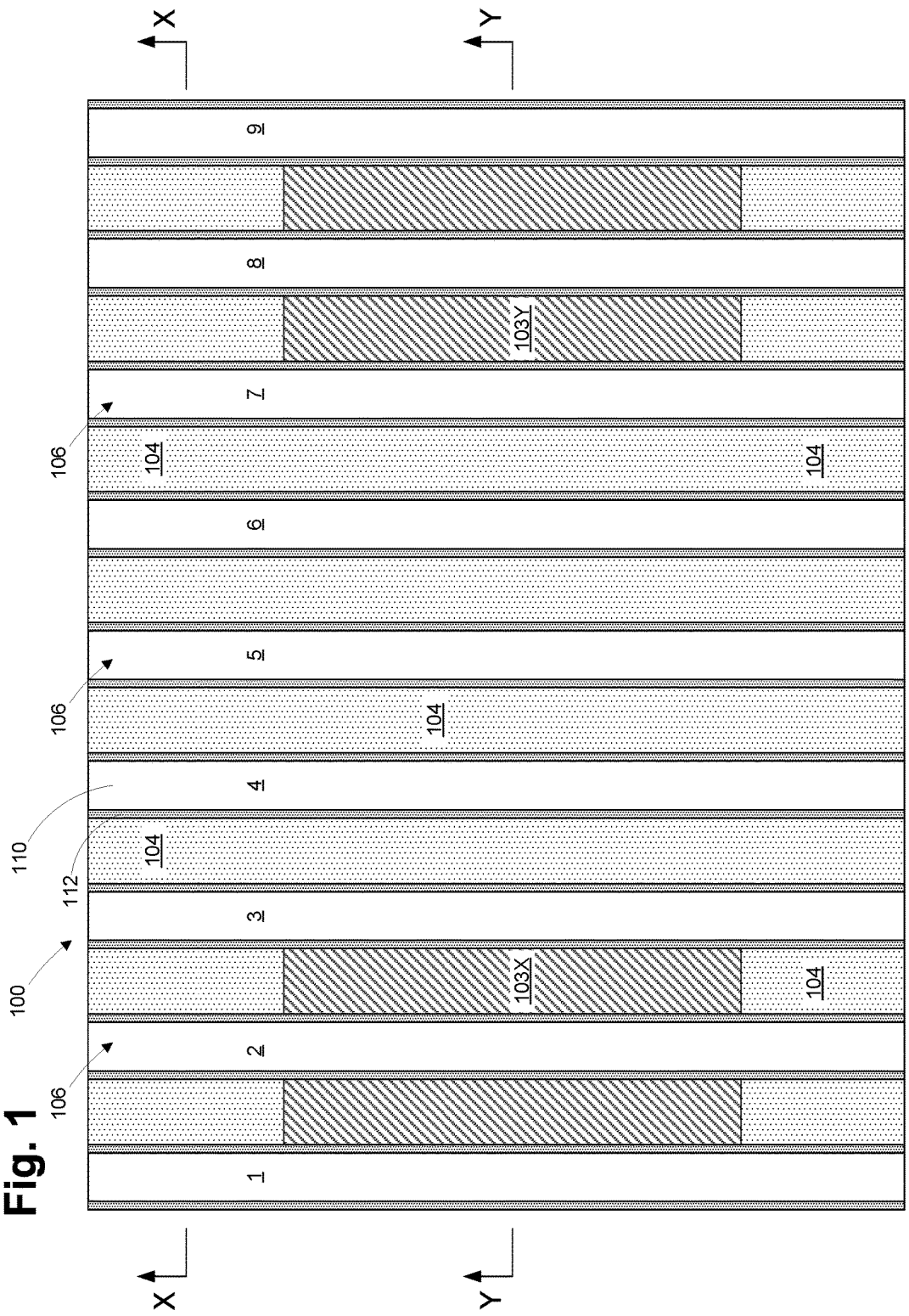

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming a resistor structure between adjacent transistor gates on an integrated circuit (IC) product and the resulting novel devices. The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, etc. As will be appreciated by those skilled in the art after a complete reading of the present application, the methods and devices disclosed herein may be employed in forming integrated circuit products using transistor devices in a variety of different configurations, e.g., planar devices, FinFET devices, etc. The gate structures of the transistor devices may be formed using either "gate first" or "replacement gate" manufacturing techniques. Thus, the presently disclosed subject matter should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail.

Figure 2:
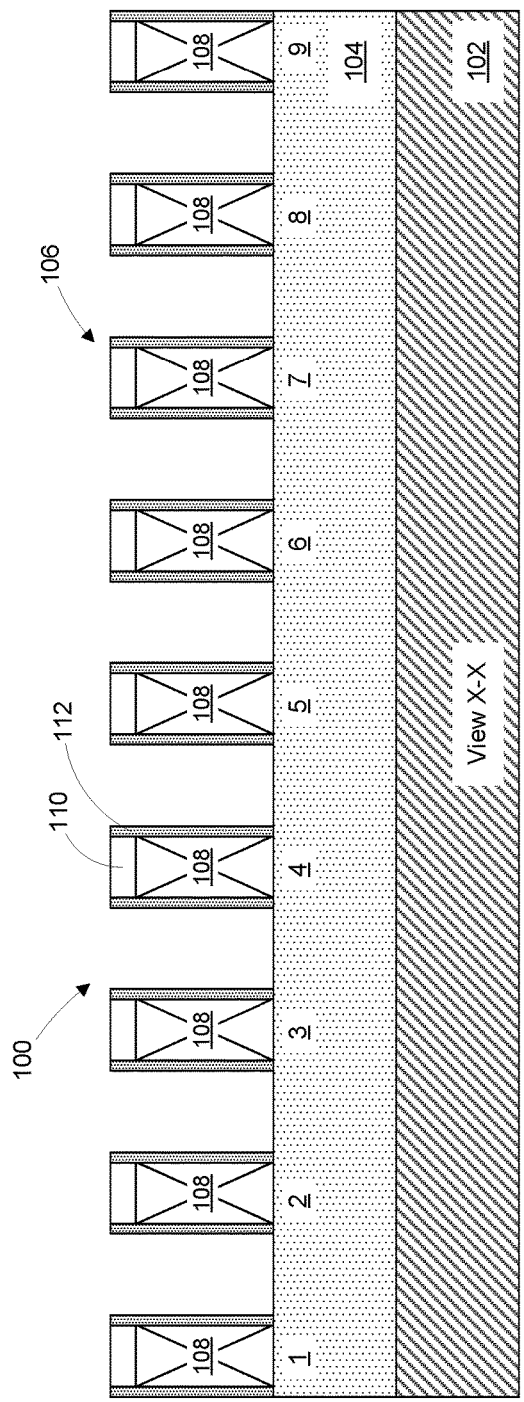
Figure 3:
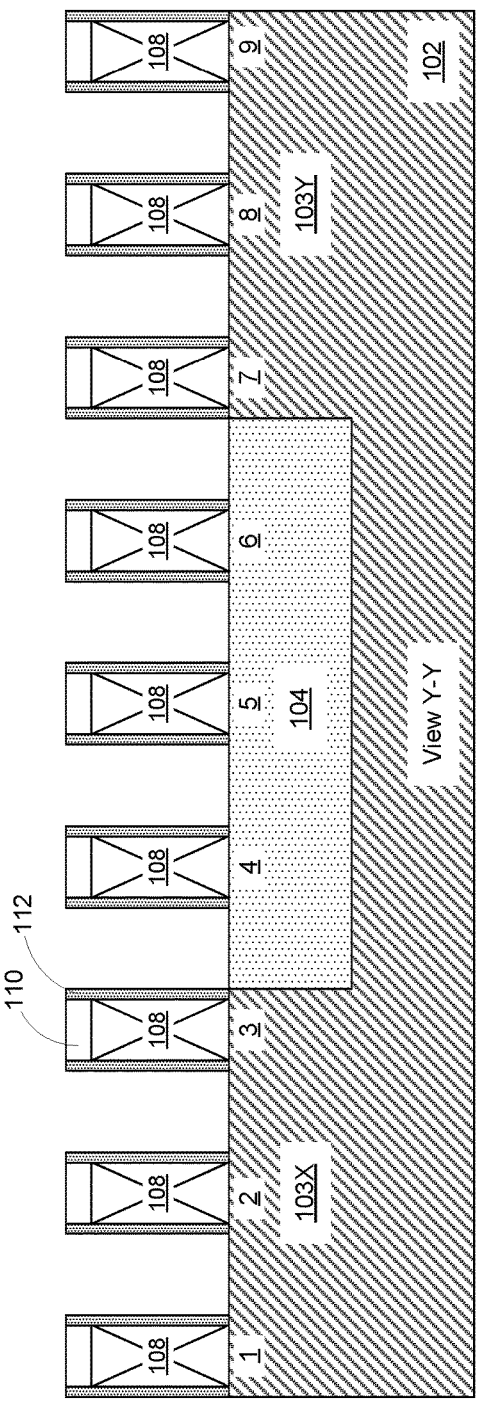

FIGS. 1-25 depict various novel methods disclosed herein for forming a resistor structure between adjacent transistor gates 106 on an integrated circuit (IC) product 100 and the resulting novel devices. FIG. 1 is a simplistic plan view of an illustrative IC product 100. The product 100 generally comprises a plurality of gates 106 (numbered 1-9 for ease of reference) that are formed above spaced apart active regions 103X, 103Y (collectively referred to by use of the reference numeral 103) defined in a semiconductor substrate 102 (see FIG. 2) by the formation of an isolation region 104 (e.g., silicon dioxide) in the substrate 102. FIG. 2 is a cross-sectional view of the product 100 taken through the location X-X indicated in FIG. 1, i.e., through the gates 106 at a location where the gates 106 are positioned above the isolation region 104. The cross-sectional view X-X is taken through the gates 106 in a gate-length direction of the transistor devices. In the case where the transistor devices are FinFET devices, the view X-X should be understood to be a cross-sectional view taken through the long axis of a fin of the transistor in a direction that corresponds to the gate length (current transport) direction of a FinFET device. FIG. 3 is a cross-sectional view of the product 100 taken through the location Y-Y indicated in FIG. 1, i.e., through the gates 106 at a location where the gates 1-3 and 7-9 are positioned above the spaced-apart active regions 103X, 103Y, respectively, and where the middle three gates 4-6 are positioned above the isolation region 104 that is located between the spaced-apart active regions 103X, 103Y. The cross-sectional view Y-Y is also taken through the gates 106 in the gate-length direction of the transistor devices. Various additional drawings contained herein contain cross-sectional views X-X and Y-Y of the product 100 at different points in the illustrative process flow disclosed herein.

The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

In the illustrative example depicted herein, the final gate structures 109 for the gates 106 of the transistor devices will be manufactured using replacement gate manufacturing techniques. With reference to FIGS. 2 and 3, at this stage in the illustrative process flow, each of the gates 106 includes a schematically depicted sacrificial gate structure 108, a gate cap 110 and a sidewall spacer 112. The sacrificial gate structures 108 may be comprised of a gate insulation layer (not separately shown), e.g., silicon dioxide, and a sacrificial gate electrode (not separately shown) comprised of, for example, amorphous silicon. The sacrificial gate structures 108 and the gate caps 110 may be formed by performing known deposition, masking and etching techniques. The sidewall spacer 112 may be formed by performing a conformal deposition process to form a conformal layer of spacer material above the sacrificial gate structures 108, the gate caps 110 and the rest of the substrate 102, and thereafter performing an anisotropic etching process. The sidewall spacers 112 and the gate caps 110 may be comprised of a variety of different materials, such as silicon nitride, SiNC, SiN, SiCO, and SiNOC, etc., and they may be made of the same or different materials. Of course, those skilled in the art will appreciate that, in some applications, one or more of the gates 106 may span across several spaced-apart active regions 103 that are separated by isolation material 104. In the view depicted in FIG. 1, gate number 2 may be the "active gate" for the active transistor device that is formed above the active region 103X, while gates 1 and 3 serve as so-called dummy gates for that transistor. In a real-world IC product 100, there may be many active gates and/or dummy gates formed across a single active region 103. As will be appreciated by those skilled in the art after a complete reading of the present application, the novel resistor structure disclosed herein may be positioned between any type of adjacent gates, i.e., it may be positioned between adjacent active gates, between adjacent dummy gates and/or between an active gate and a dummy gate. Thus, the subject matter disclosed herein should not be considered to be limited to the simplistic examples depicted herein.

Figure 4:
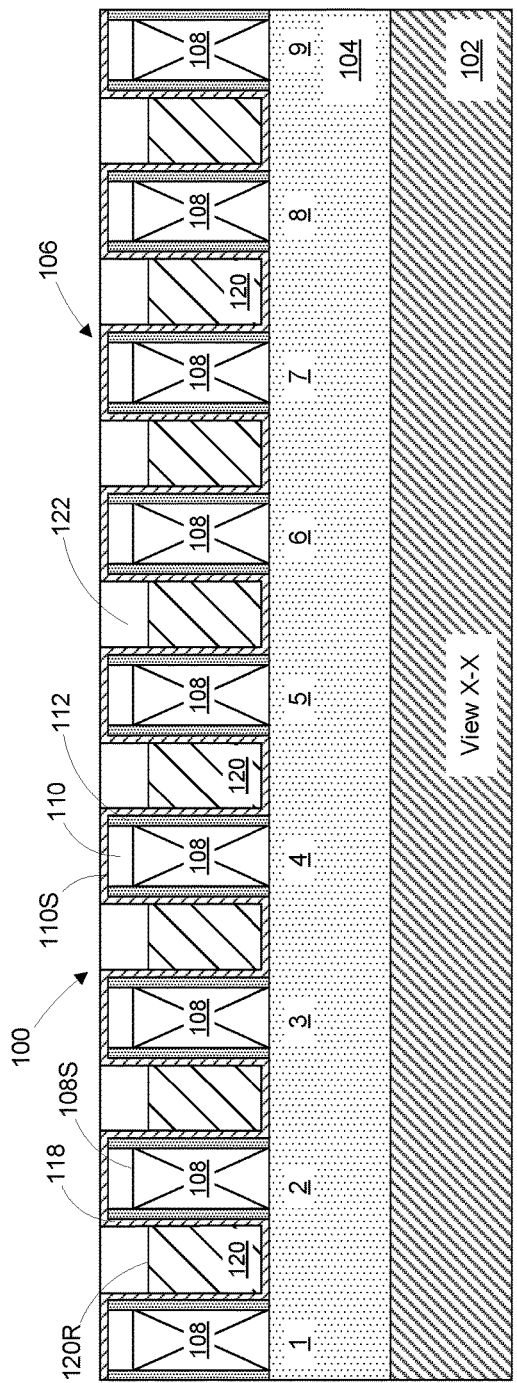
Figure 5:
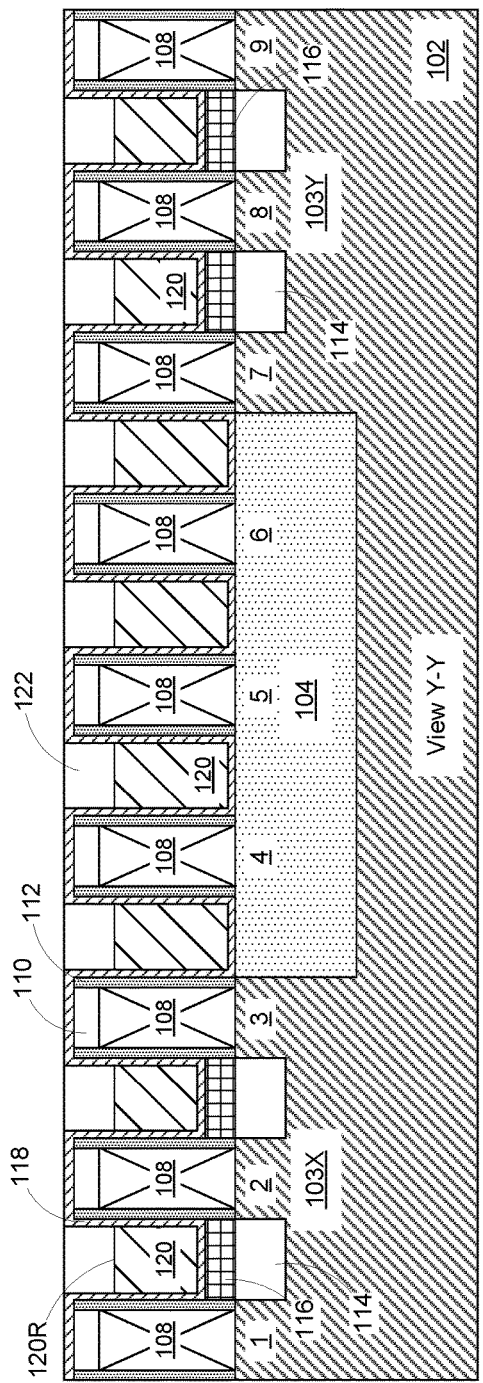

FIGS. 4 and 5 depict the product 100 after several process operations were performed. First, illustrative doped source/drain regions 114 were formed in the active regions 103 by forming one or more patterned masking layers (not shown) that expose the source/drain regions, and thereafter performing one or more ion implantation processes through the patterned masking layer. Then, an epi semiconductor material 116 was formed on the exposed portions of the active regions 103 (or fins in the case of a FinFET device) by performing an epitaxial growth process. The epi material 116 may be formed to any desired thickness. However, it should be understood that the epi material 116 need not be formed in all applications. Next, a conformal deposition process, e.g., an atomic layer deposition (ALD) process, was performed to form a contact etch stop layer 118 across the product. The conformal etch stop layer 118 may be comprised of a variety of materials, e.g., silicon nitride, SiNC, SiN, SiCO, and SiNOC, etc. and it may be formed to any desired thickness.

With continuing reference to FIGS. 4 and 5, a layer of conductive resistor material 120 was then blanket-deposited on the product 100 so as to overfill the openings above the conformal etch stop layer 118 and between adjacent gates 106 across the entire substrate 102. The layer of conductive resistor material 120 may be comprised of any of a variety of conductive materials, e.g., polysilicon, a metal, a metal compound, a metal-containing material, etc. At that point, a chemical mechanical planarization (CMP) process was performed to planarize the layer of conductive resistor material 120 using the conformal etch stop layer 118 as a polish stop layer. Then, a recess etching process was performed on the layer of conductive resistor material 120 such that it has a recessed upper surface 120R. The amount of the recessing of the layer of conductive resistor material 120 may vary depending upon the particular application. As described more fully below, selected portions of the recessed conductive resistor material 120 between adjacent gates 3-4, between adjacent gates 4-5, between adjacent gates 5-6 and between adjacent gates 6-7 will constitute the final resistor structure 150 that will be formed on the product 100. The recessing of the layer of the conductive resistor material 120 defines a plurality of individual recessed lines of the conductive resistor material 120 that are positioned between a pair of laterally adjacent gates. In one illustrative example, each of the individual recessed lines of the conductive resistor material 120 has a recessed upper surface 120R that is positioned at a level that is at least below the upper surface 110S of the gate caps 110 on the adjacent gates 106. In another embodiment, the recessed upper surface 120R on each of the individual recessed lines of the conductive resistor material 120 is positioned at a level that is at least below the upper surface 108S of the sacrificial gate structures 108. The overall vertical thickness of each of the individual recessed lines of the conductive resistor material 120 may vary depending upon the particular application and the desired characteristics of the completed resistor structure. In one illustrative example, each of the individual recessed lines of the conductive resistor material 120 may have a vertical thickness of about 10-80 nm. Next, a layer of insulating material 122 was blanket-deposited on the product 100 so as to overfill the openings above the recessed upper surface 120R of the individual recessed lines of the conductive resistor material 120 positioned between the gates 106. At that point, a CMP process was performed to planarize the layer of insulating material 122 using the conformal etch stop layer 118 as a polish stop layer. The layer of insulating material 122 may be made from a variety of insulating materials, e.g., silicon dioxide, SiCO, a low-k material (k value of 8 or less), etc.

FIGS. 6-9 depict various processing steps that are performed to remove portions of the sacrificial gates structures 108 on opposite ends of the middle five gates (gates 3-7) of the product 100 in the areas where conductive contacts (not yet formed) will be formed to contact the resistor structure that has yet to be formed on the product 100. As described more fully below, gate isolation structures 126 will be formed in the openings formed by removing portions of the sacrificial gate structures 108 such that there will be substantially no path for an electrical short to form between the conductive contacts (not yet formed) for the resistor structure and the final gate structures (not yet formed) on the product 100.

FIG. 6 is a plan view of the product 100 with the active regions 103 shown in dashed lines. FIG. 6 also depicts the openings 124 in a patterned etch masking layer (not shown), e.g., photoresist, OPL, etc., that was formed above the product 100. As mentioned above, the openings 124 expose portions of the five middle gates 106 (gates 3-7) positioned above the isolation region 104 where contact structures for the illustrative example of the resistor structure disclosed herein will be formed. With reference to FIGS. 7 and 8, after the patterned etch mask (with the openings 124 formed therein) was formed, one or more etching processes were performed though the patterned etch mask to selectively remove the exposed portions of the conformal etch stop layer 118 and the gate caps 110 above opposite ends of the middle five gates (3-7) so as to expose the underlying sacrificial gate structures 108. Then, one or more etching processes were performed to remove the exposed sacrificial gate structures 108 on opposite ends of the middle five gates (3-7) in the areas defined by the openings 124 in the patterned mask layer. These process operations result in the formation of cavities between the spacers 112 in the areas below the openings 124 in the patterned mask layer. At that point, the patterned etch mask was removed.

Then, a plurality of gate isolation structures 126 were formed in the cavities defined by the removal of the portions of the sacrificial gate structures 108 on opposite ends of the middle five gates 3-7. The gate isolation structures 126 may be formed by blanket-depositing a layer of the material for the gate isolation structures 126 above the product 100 and in the cavities formerly occupied by the now-removed portions of the sacrificial gate structures 108 for the middle five gates 3-7. At that point, another CMP process was performed using the layer of insulating material 122 as a polish-stop so as to remove excess amounts of the material for the gate isolation structures 126. FIG. 9 is a plan view of the product 100 after the gate isolation structures 126 were formed. The axial length of the gate isolation structures 126 in a direction that corresponds to the axial length of the sacrificial gate structures 108 may vary depending upon the particular application. As depicted, the gate isolation structures 126 are positioned on opposite ends of the middle five gates (3-7) above the isolation material 104. In some applications, the entirety of the sacrificial gate structures 108 between the depicted gate isolation structures 126 (inclusive) may be removed. Thereafter, a "one-piece" gate isolation structure 126 for each of the middle five gates 3-7 may be formed in the corresponding relatively elongated cavities between the spacers 112.

Figure 12:
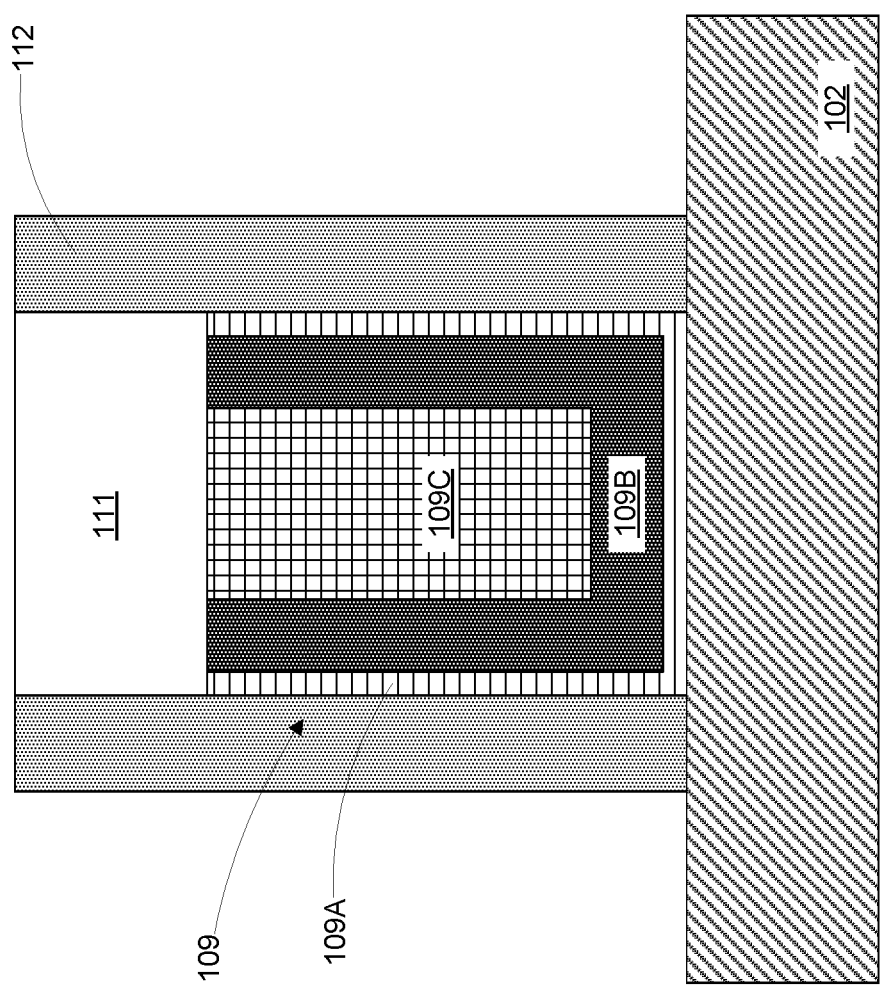

As mentioned above, in the illustrative example depicted herein, the gate structures for the transistor devices will be manufactured using replacement gate manufacturing techniques. Accordingly, FIGS. 10-12 depict the product 100 after simplistically depicted final gate structures 109 and final gate caps 111 were formed on the product 100. FIG. 12 is an enlarged view of an example of such an illustrative final gate structure 109. In general, formation of the final gate structures 109 involves the following process steps. First, a CMP process was performed to remove remaining portions of the conformal etch stop layer 118 and the original gate caps 110 so as to thereby expose the sacrificial gate structures 108 of the gates 106. Then, one or more etching processes were performed to remove the exposed sacrificial gate structures 108. These process operations result in the formation of replacement gate cavities in the area between the spacers 112 (and the gate isolation structures 126 for the middle five gates 3-7). Thereafter, the simplistically depicted replacement (final) gate structures 109 and the final gate caps 111 were formed in the replacement gate cavities using well-known manufacturing techniques. In the case of the middle five gates (3-7), the replacement gate cavities are bounded by the gate isolation structures 126 and the spacers 112.

Typically, the materials for the replacement gate structures 109 are sequentially formed in the gate cavities. For example, with reference to FIG. 12, a first conformal deposition process may be performed to form a gate insulation layer 109A across the product and within the replacement gate cavities, followed by performing a second conformal deposition process to form a work function adjusting metal layer 109B across the product and on the gate insulation layer 109A within the replacement gate cavities. Next, a blanket deposition process may be performed to form a bulk conductive material 109C, e.g., tungsten, aluminum, polysilicon, etc., on the work function adjusting metal layer 109B so as to over-fill the remaining un-filled portion of the replacement gate cavities. Thereafter, one or more CMP processes may be performed so as to remove excess portions of the gate insulation layer 109A, the work function adjusting metal layer 109B and the bulk conductive material 109C that are positioned above the layer of insulating material 122 and outside of the replacement gate cavities.

At that point, one or more recess etching processes were performed to recess the vertical height of the materials of the replacement gate structures 109 within the replacement gate cavities so as to make room (in a vertical sense) for the gate caps 111. The gate caps 111 may be formed by blanket depositing a layer of the material for the gate caps 111 above the devices and in the space above the recessed gate structures 109 within the replacement gate cavities. Then, another CMP process may be performed using the layer of insulating material 122 as a polish-stop so as to remove excess amounts of the material for the gate caps 111. At this point in the processing, the final replacement gate structures 109 with final gate caps 111 have been formed on the IC product 100. Of course, the materials of construction for the replacement gate structures 109 may vary depending upon whether the device is an N-type device or a P-type device. Additionally, the replacement gate structures 109 may have a different number of layers of material depending upon the type of device under construction, e.g., the replacement gate structure 109 for an N-type device may comprise more layers of conductive material than are present in a replacement gate structure 109 for a P-type device. The gate insulation layer 109A may be comprised of a variety of different materials, such as, for example, silicon dioxide, a so-called high-k (k greater than 10) insulation material (where k is the relative dielectric constant), etc. The work function adjusting metal layer 109B may be comprised of a variety of different materials, e.g., titanium nitride, TiC, TiAlC, W, Al, etc., depending upon the type of device (N or P) being manufactured. The gate caps 111 may be made of a variety of different materials, e.g., silicon nitride, SiCN, SiN/SiCN, SiOC, SiOCN, etc.

Figure 13:
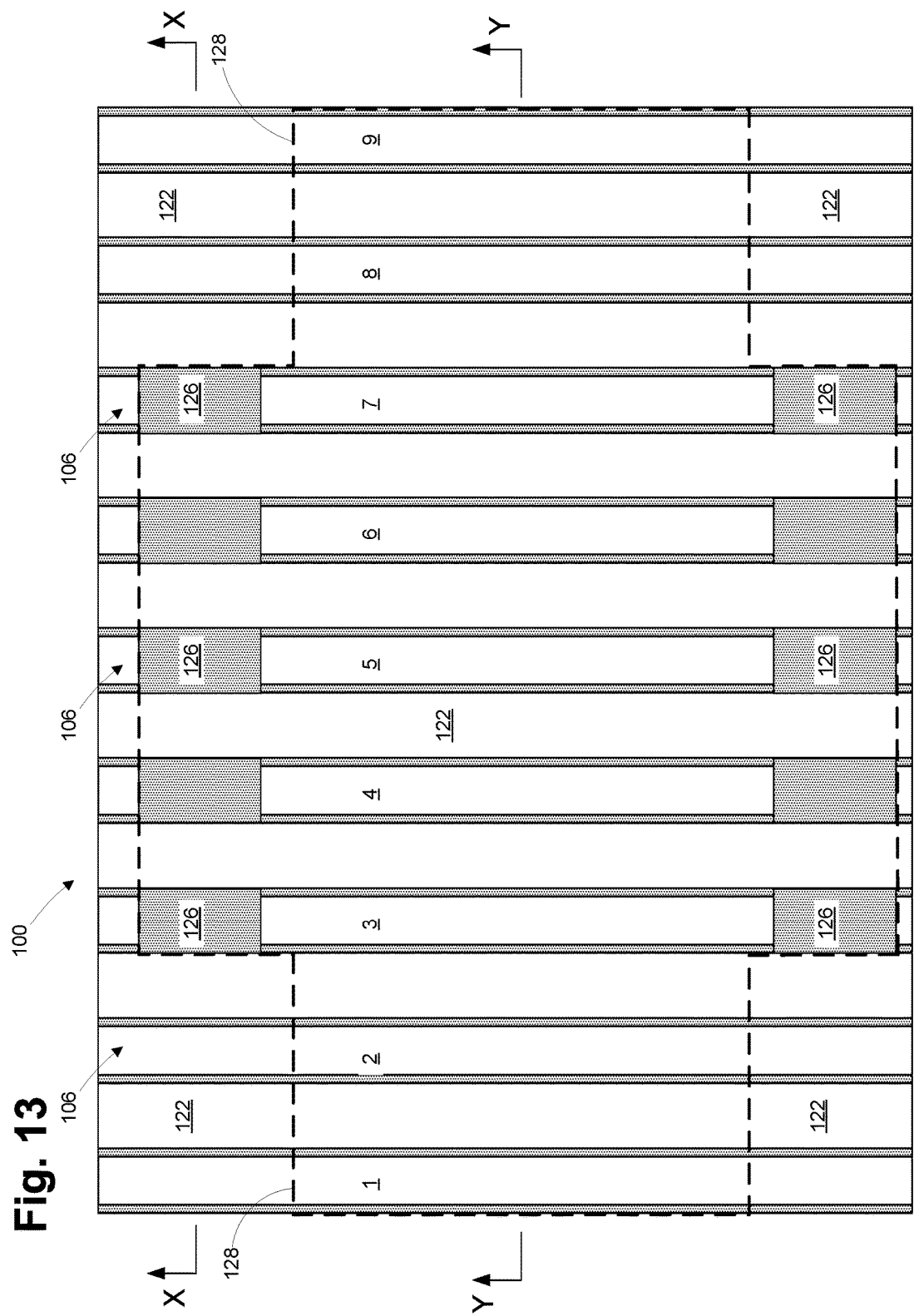

FIGS. 13-16 depict one illustrative process flow wherein various processing steps are performed to remove portions of the layer of insulating material 122 and the individual recessed lines of the conductive resistor material 120 in areas above the isolation structure 104 while leaving the portions of the individual recessed lines of the conductive resistor material 120 in position above the spaced-apart active regions 103 and above the isolation material 104 positioned between the spaced-apart active regions 103. FIG. 13 is a plan view of the product 100 in which the active regions 103 are not shown so as to not overly complicate the drawing. FIG. 13 also depicts another patterned etch masking layer (not shown), e.g., photoresist, OPL, etc., that was formed above the product 100. This patterned masking layer 128 covers portions of the substrate 102 above the active regions 103 and also covers the isolation material 104 between the spaced-apart active regions 103 as well as the areas where the contacts for the final resistor structure 150 will be formed. Stated another way, this patterned etch mask 128 has openings that expose the areas above the insulation layer 122 and the portions of the individual recessed lines of the conductive resistor material 120 in areas outside of the active regions 103 and portions of the isolation material 104 positioned between the active regions 103.

Figure 14:
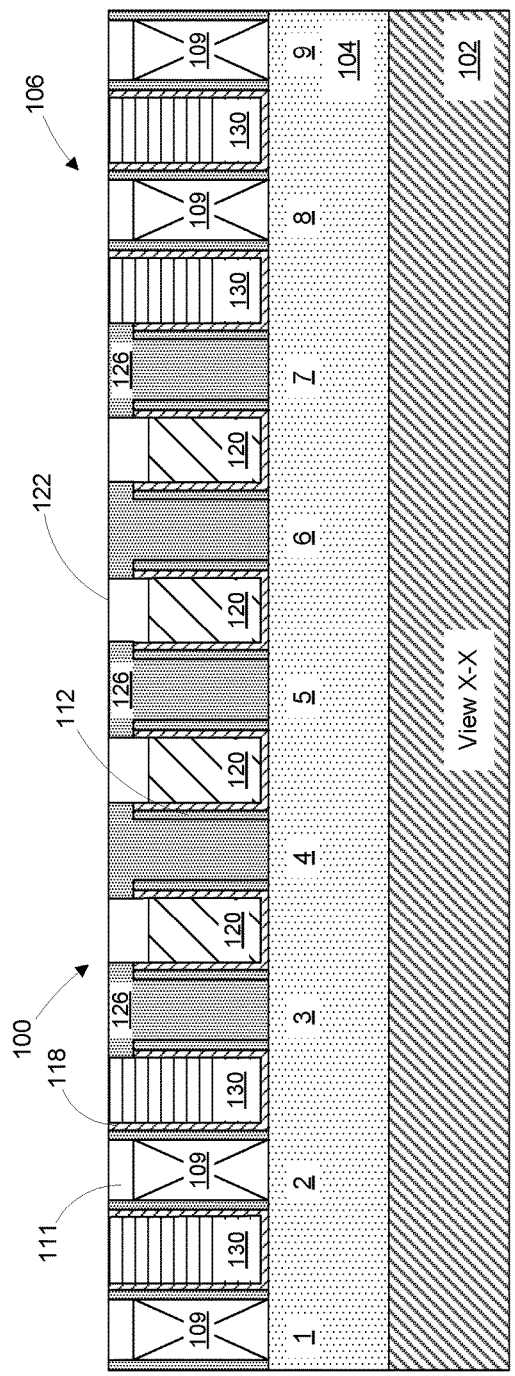
Figure 15:
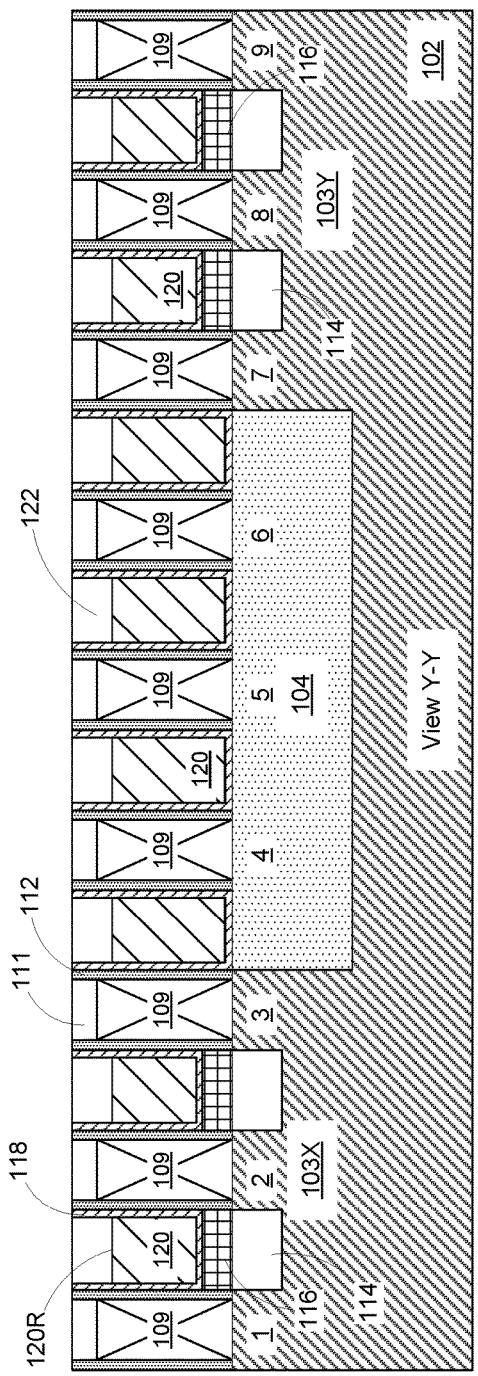
Figure 16:
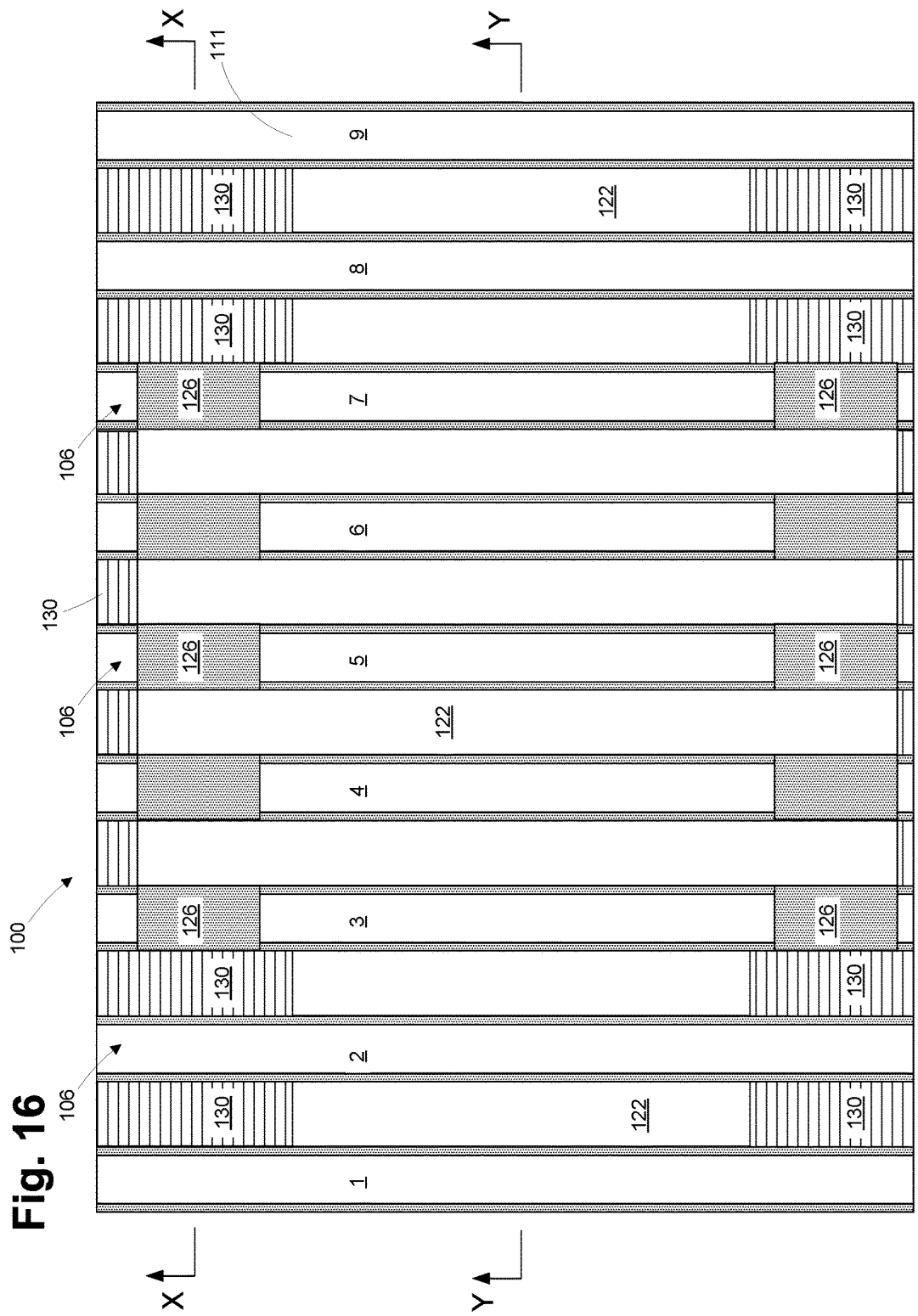

With reference to FIGS. 14 and 15, after this second patterned etch mask 128 was formed, one or more etching processes were performed though the patterned etch mask 128 to selectively remove the portions of the layer of insulating material 122 and each of the individual recessed lines of the conductive resistor material 120 positioned above the isolation material 104 that are not covered by the masking layer 128. At that point, the patterned etch mask 128 was removed. Thereafter, an insulation material 130 was formed on the conformal etch stop layer 118 in the spaces previously occupied by the now-removed portions of the recessed conductive resistor material 120 and the now-removed portions of the layer of insulating material 122. The insulation material 130 may be formed by blanket-depositing a layer of the material for the insulation material 130 above the product 100 and in the openings formerly occupied by the now-removed portions of the individual recessed lines of the conductive resistor material 120 and the now-removed portions of the layer of insulating material 122. At that point, another CMP process may be performed using the gate caps 111 as a polish-stop so as to remove excess amounts of the insulation material 130. The insulation material 130 may be comprised of a variety of different materials, such as, for example, silicon dioxide, a so-called low-k (k less than or equal to about 7 where k is the relative dielectric constant), etc. FIG. 16 is a plan view of the product 100 after the regions of insulation material 130 were formed on the product 100.

Figure 17:
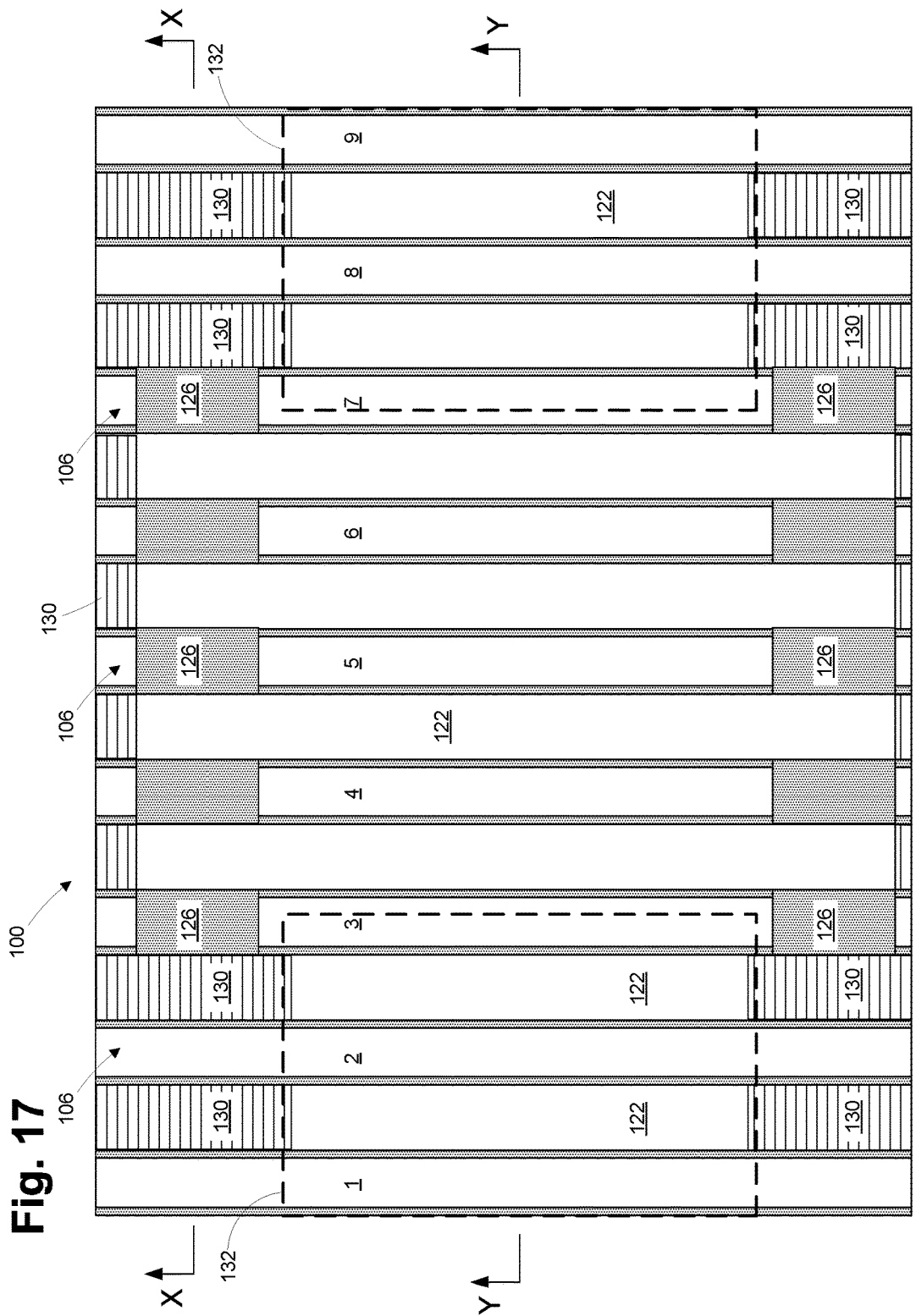
Figure 18:
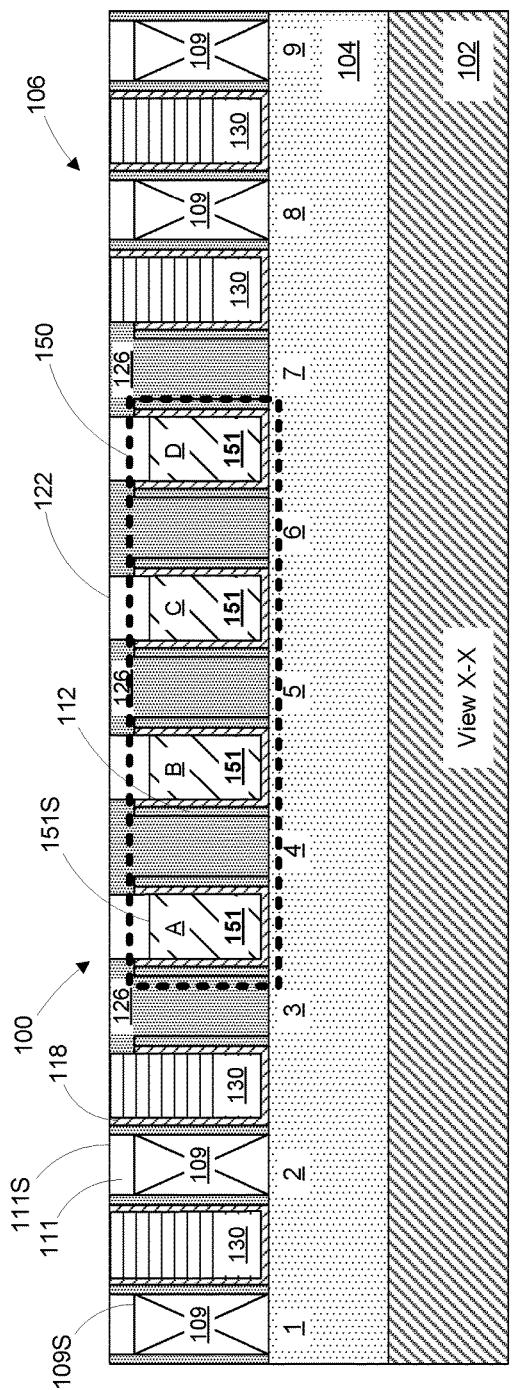
Figure 19:
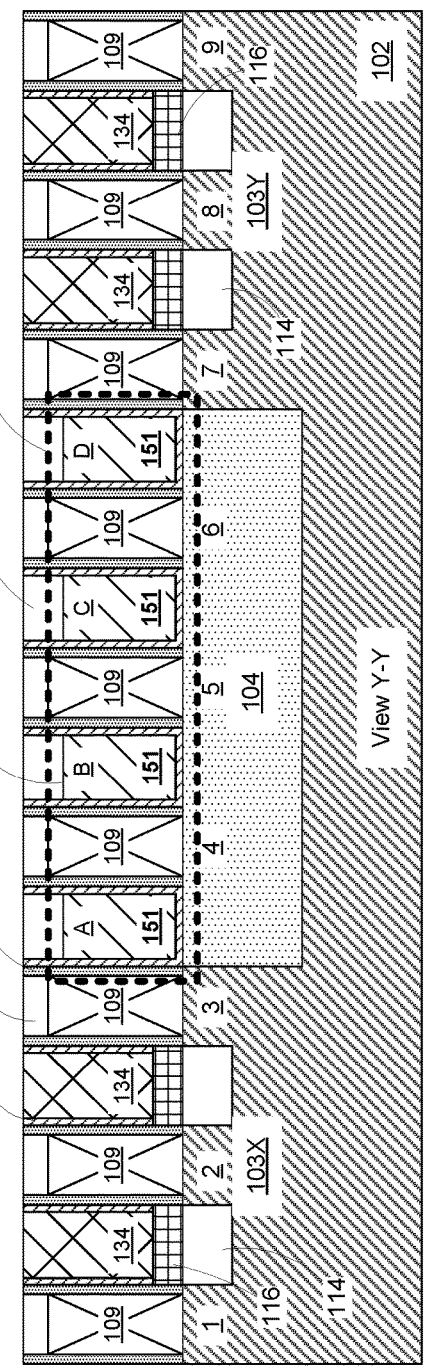

FIGS. 17-20 depict one illustrative process flow wherein various processing steps are performed to remove portions of the layer of insulating material 122, selected portions of the individual recessed lines of the conductive resistor material 120 and the conformal etch stop layer 118 in areas above the spaced-apart active regions 103, while leaving those materials in position above the isolation material 104 positioned between the spaced-apart active regions 103 (between the gates 3-4, between the gates 4-5, between the gates 5-6 and between the gates 6-7). FIG. 17 is a plan view of the product 100. The active regions 103 are not shown in FIG. 17 so as to not overly complicate the drawing. FIG. 17 also depicts another patterned etch masking layer (not shown), e.g., photoresist, OPL, etc., that was formed above the product 100. This latest patterned masking layer has openings 132 that are located above the active regions 103.

With reference to FIGS. 16 and 17, after this patterned etch mask with the openings 132 therein was formed, one or more etching processes were performed though the patterned etch mask to selectively remove the portions of the layer of insulating material 122, the portions of the individual recessed lines of the conductive resistor material 120 and at least the bottom portion of the conformal etch stop layer 118 positioned below the areas defined by the openings 132. At that point, the epi material 116 above the source/drain regions 114 is exposed. Thereafter, the patterned etch mask was removed. Next, illustrative conductive source/drain contact structures 134 (e.g., trench silicide structures) were formed between the adjacent gates 106 positioned above the active regions 103 so as to provide a means to electrically contact the underlying source/drain regions 114. The conductive source/drain contact structures 134 may be formed by performing a variety of known processing techniques. In one embodiment, the conductive material(s) for the conductive source/drain contact structures 134 may be deposited above the product 100 and in the openings formerly occupied by the now-removed portions of the individual recessed lines of the conductive resistor material 120, the now-removed portions of the layer of insulating material 122 and the now-removed portions of the conformal etch stop layer 118. At that point, another CMP process may be performed using the gate caps 111 as a polish-stop so as to remove excess amounts of the conductive materials. The conductive source/drain contact structures 134 may be comprised of a variety of different materials, such as, for example, WSi, etc.

Figure 20:
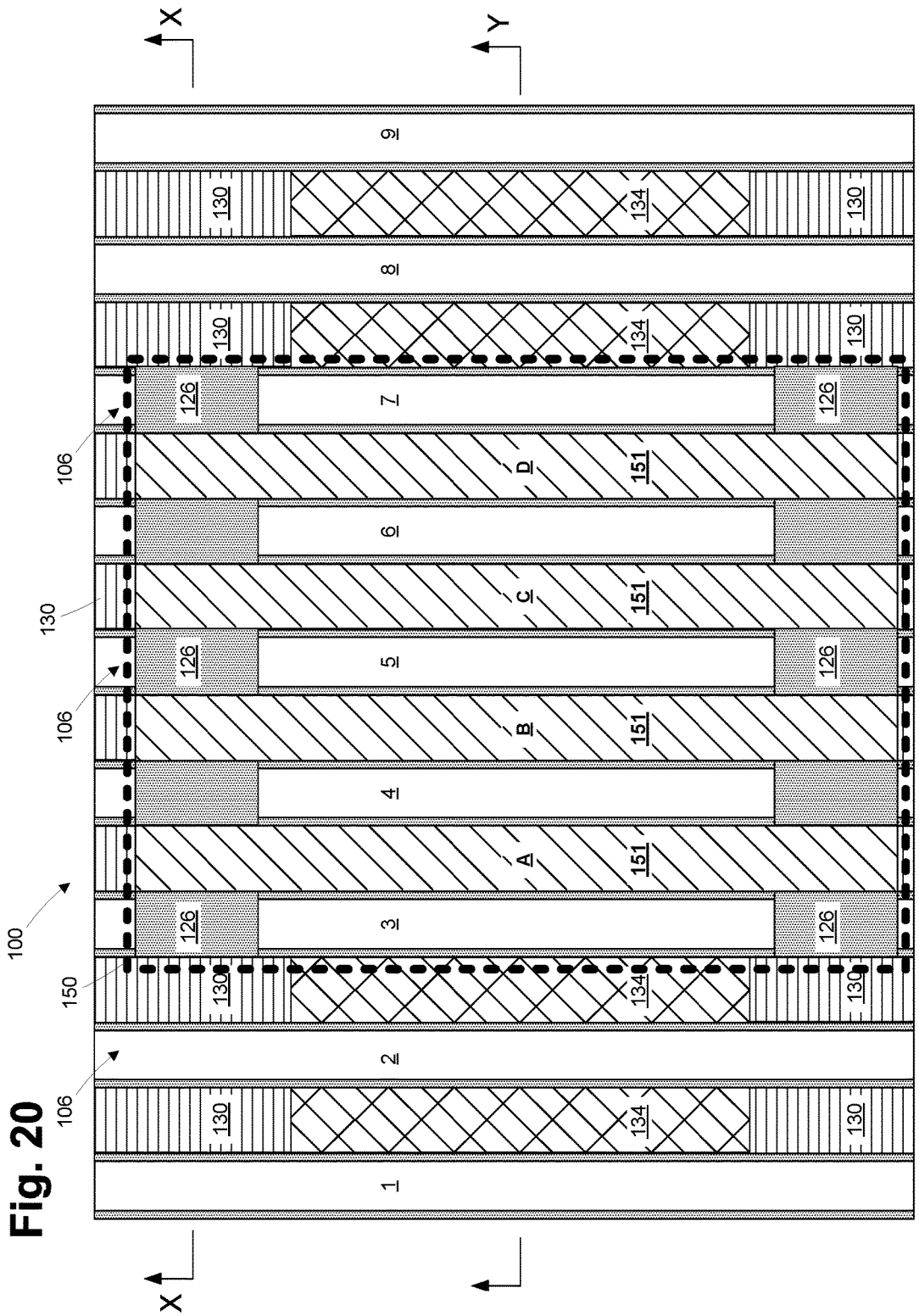

FIG. 20 is a plan view of the product 100 after the conductive source/drain contact structures 134 were formed on the product 100. However, in this view, the insulation material 122 is not shown so as to show the completed resistor structure 150 (which has been generally surrounded by dashed lines in FIGS. 18-20). In this particular example, the resistor structure 150 is comprised of potions of four of the individual recessed lines of the conductive resistor material 120, which have been labeled with the letters A, B, C and D for ease of reference and which will now be referred to as conductive resistor structures 151. As depicted, the conductive resistor structure A is positioned between the adjacent gates 3-4, the conductive resistor structure B is positioned between the adjacent gates 4-5, the conductive resistor structure C is positioned between the adjacent gates 5-6 and the conductive resistor structure D is positioned between the adjacent gates 6-7. Of course, as will be appreciated by those skilled in the art after a complete reading of the present application, the resistor structure 150 may be comprised of any desired number of conductive resistor structures 151, or even a single conductive resistor structure 151. Additionally, the axial length of the conductive resistor structures 151 may be varied depending upon the application, and they need not all have the same axial length when the resistor structure 150 is comprised of multiple conductive resistor structures 151. In one illustrative example, the conductive resistor structures 151 are formed such that the upper surface 151S of the conductive resistor structures 151 is positioned at a level that is at least below the upper surface 111S of the final gate caps 111 on the adjacent gates 106. In another embodiment, the recessed upper surface 151S is positioned at a level that is at least below the upper surface 109S of the final gate structures 109. The overall vertical thickness of the conductive resistor structures 151 may vary depending upon the particular application and the desired operational characteristics of final resistor structure 150. In one illustrative example the conductive resistor structures 151 may have a vertical thickness of about 10-80 nm.

Figure 21:
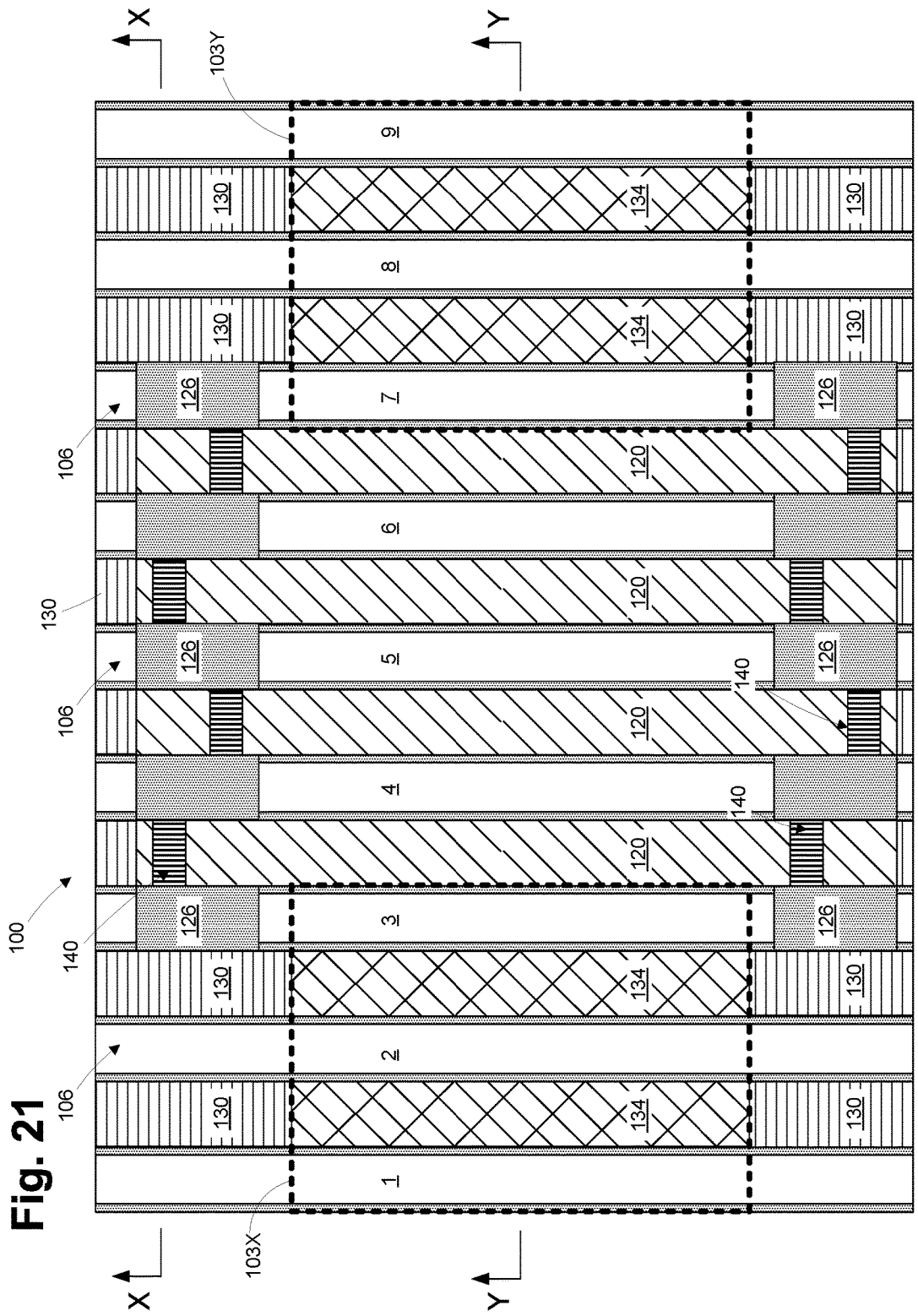

FIGS. 21-23 depict the formation of conductive contact structures 140 on opposite ends of the conductive resistor structures 151 of the resistor structure 150. As shown in the plan view (FIG. 21), the view X-X is taken through two of the conductive contact structures 140, but all of the conductive contact structures 140 may be formed using the same technique. Additionally, the conductive contact structures 140 for the resistor structure 150 may be formed at the same time as conductive S/D contact structures (CA) (not shown) are formed to contact the conductive source/drain contact structures 134 and/or at the same time as conductive gate contact structures (CB) (not shown) are formed to contact the gate structures 109. In one illustrative process flow, a layer of insulating material 142 (not shown in FIG. 21), e.g., silicon dioxide, a low-k insulating material, etc., may be deposited above the product 100. Thereafter contact openings 144 may be formed in the layer of insulating material 142 and the layer of insulating material 122 positioned above the conductive resistor structures 151. In the example shown in FIG. 22, the contact openings 144 expose portions of the conductive resistor structures A and C. At that point, a conductive material, e.g., a metal or a metal-containing material, may be deposited in the contact openings 144. Thereafter, a CMP process may be performed to remove excess amounts of the conductive material from above the upper surface of the layer of insulating material 142.

As will be appreciated by those skilled in the art after a complete reading of the present application, in the case where the resistor structure 150 is comprised of multiple conductive resistor structures 151, the conductive contact structures 140 may be located such that the conductive resistor structures 151 are arranged in an electrically parallel configuration or in an electrically series configuration, or a combination parallel/series configuration. In the example shown in FIG. 21, the conductive resistor structures 151 are arranged in an electrically parallel configuration.

In the previously discussed examples, the resistor structure 150 was formed such that an entirety of the resistor structure 150 is positioned above the isolation material 104. However, as will be appreciated by those skilled in the art after a complete reading of the present application, the methods disclosed herein may be employed to form a resistor structure 150 for an IC product wherein the entirety of the resistor structure 150 is positioned above an active region(s) or sections of the substrate, as shown in FIGS. 24-25. That is, due to the presence of the conformal etch stop layer 118, the conductive resistor structures 151 may be formed above the underlying substrate 102 since the conformal etch stop layer 118 provides electrical isolation between the conductive resistor structures 151 and the underlying substrate 102.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a resistor on an integrated circuit product, comprising:
    forming first and second adjacent gates above a semiconductor substrate, each of said first and second adjacent gates comprising a gate structure and a gate cap, said first and second adjacent gates having a space there between;
    forming a conductive resistor structure in said space between said first and second adjacent gates by,
        depositing a layer of conductive resistor material so as to overfill said space between said first and second adjacent gates;
        performing a planarization process to remove portions of said layer of conductive resistor material positioned outside of said space so as to form an initial structure that comprises said conductive resistor material in said space, said initial structure comprising an initial thickness and an initial upper surface that us substantially planar with an uppermost surface of said gate caps of said first and second adjacent gates; and
        performing a recess etching process on said initial structure so as to reduce said initial thickness and thereby form said conductive resistor structure, wherein said conductive resistor structure comprises said conductive resistor material and a recessed uppermost surface that is positioned at a level that is below a level of said uppermost surface of said gate caps of said first and second adjacent gates; and
    forming first and second separate conductive resistor contact structures, each of which is conductively coupled to said conductive resistor structure.

2. The method of claim 1, wherein said first and second adjacent gates are formed from one of a plurality of planar transistor devices or a plurality of FinFET transistor devices, wherein said conductive resistor structure comprises at least one of polysilicon, a metal, a metal-containing material or a metal compound, and wherein said gate structure comprises a high-k gate insulation layer and at least one layer of a metal-containing material.

3. The method of claim 1, wherein each of said first and second adjacent gates are active gates for first and second transistor devices, respectively.

4. The method of claim 1, wherein said first gate is an active gate for a first transistor device and said second gate is a dummy gate for said first transistor device.

5. The method of claim 1, wherein said recessed uppermost surface of said conductive resistor structure is positioned at a level that is below a level of an uppermost surface of said gate structures of said first and second adjacent gates.

6. The method of claim 1, wherein an entirety of said conductive resistor structure is positioned above one of an isolation material formed in said semiconductor substrate or an active region of said semiconductor substrate.

7. The method of claim 1, wherein said conductive resistor structure is laterally bounded within said space by a contact etch stop layer positioned on said first and second adjacent gates.

8. A method of forming a resistor on an integrated circuit product, comprising:
    forming a plurality of laterally spaced apart gates above a semiconductor substrate, each of said plurality of laterally spaced apart gates comprising a gate structure and a gate cap, wherein a space is present between each laterally adjacent pair of said plurality of gates;
    depositing a layer of conductive resistor material above and between all of said plurality of laterally spaced apart gates so as to overfill all of said spaces;
    performing a planarization process to remove portions of said layer of conductive resistor material positioned outside of said spaces so as to form a plurality of initial structures that comprise said conductive resistor material in said spaces, said initial structures comprising an initial thickness and an initial upper surface that is substantially planar with an uppermost surface of said gate caps of said plurality of laterally spaced apart gates;
    performing a recess etching process on said plurality of initial structures so as to reduce said initial thickness and thereby form a plurality of individual recessed lines of said conductive resistor material, each of which is positioned between a respective pair of said plurality of laterally spaced apart gates, each of said individual recessed lines of said conductive resistor material having a recessed uppermost surface that is positioned at a level that is at least below a level of said uppermost surface of said gate caps on said plurality of laterally spaced apart gates;

forming a patterned etch mask that covers at least portions of a plurality of said individual recessed lines and exposes portions of said plurality of individual recessed lines;

with said patterned etch mask in position, performing at least one etching process to remove said exposed portions of said plurality of individual recessed lines while leaving said covered portions of said plurality of said individual recessed lines in place, wherein said covered portions of said plurality of said individual recessed lines constitute a plurality of conductive resistor structures, each of which is positioned between a respective pair of laterally adjacent gates;

removing said patterned etch mask; and forming a plurality of conductive resistor contact structures that are conductively coupled to said plurality of conductive resistor structures.

9. The method of claim 8, wherein said plurality of conductive resistor structures consists of four conductive resistor structures.

10. The method of claim 8, wherein said plurality of conductive resistor contact structures are formed such that said plurality of conductive resistor structures are in an electrically parallel configuration.

11. The method of claim 8, wherein said plurality of conductive resistor contact structures are formed such that said plurality of conductive resistor structures are in an electrically series configuration.

12. The method of claim 8, wherein, prior to depositing said layer of conductive resistor material, the method further comprises forming a conformal etch stop layer above and between all of said plurality of laterally spaced apart gates and wherein depositing said layer of conductive resistor material comprises depositing said layer of conductive resistor material on and in contact with said conformal etch stop layer.

13. The method of claim 12, wherein, prior to performing said at least one etching process to remove said exposed portions of said plurality of individual recessed lines, the method further comprises forming a layer of insulating material above each of said individual recessed lines.

14. The method of claim 12, wherein performing said at least one etching process to remove said exposed portions of said plurality of individual recessed lines removes portions of said individual recessed lines that are positioned above source/drain regions for a plurality of transistor devices, and wherein the method further comprises forming conductive source/drain contact structures in areas previously occupied by said individual recessed lines of said conductive resistor material that were positioned above said source/drain regions.

15. The method of claim 12, wherein performing said at least one etching process to remove said exposed portions of said plurality of individual recessed lines removes portions of said individual recessed lines that are positioned above isolation material positioned in said semiconductor substrate, and wherein the method further comprises forming a low-k insulating material in areas previously occupied by said individual recessed lines that were positioned above said isolation material positioned in said semiconductor substrate.

16. The method of claim 12, wherein each of said plurality of conductive resistor structures are laterally bounded by said contact etch stop layer.

* * * * *

UNITED STATES PATENT AND TRADEMARK OFFICE
CERTIFICATE OF CORRECTION

PATENT NO. : 10,249,616 B2  
APPLICATION NO. : 15/627835  
DATED : April 2, 2019  
INVENTOR(S) : Hui Zang et al.

Page 1 of 1

It is certified that error appears in the above-identified patent and that said Letters Patent is hereby corrected as shown below:

In the Claims

Column 11, Line 58 (Claim 1, Line 9), change "by," to -- by: --.

Column 12, Line 1 (Claim 1, Line 19), change "us" to -- is --.

Signed and Sealed this
Seventh Day of May, 2019

Andrei Iancu
*Director of the United States Patent and Trademark Office*